US011393619B2

(12) United States Patent
Cheng et al.

(10) Patent No.: US 11,393,619 B2
(45) Date of Patent: Jul. 19, 2022

(54) TRIPLE INDUCTOR TRANSFORMER FOR MULTIBAND RADIO FREQUENCY INTEGRATED CIRCUITS

(71) Applicant: QUALCOMM Incorporated, San Diego, CA (US)

(72) Inventors: Haitao Cheng, San Jose, CA (US); Sherif Mahmoud Shakib Roshdy, San Diego, CA (US); Abbas Abbaspour-Tamijani, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 655 days.

(21) Appl. No.: 16/172,378

(22) Filed: Oct. 26, 2018

(65) Prior Publication Data

US 2019/0378640 A1    Dec. 12, 2019

Related U.S. Application Data

(60) Provisional application No. 62/682,736, filed on Jun. 8, 2018.

(51) Int. Cl.
*H01F 5/00* (2006.01)
*H01F 19/06* (2006.01)
(Continued)

(52) U.S. Cl.
CPC ......... *H01F 19/06* (2013.01); *H01F 27/2804* (2013.01); *H01F 27/29* (2013.01);
(Continued)

(58) Field of Classification Search
CPC .................................................. H01F 2021/125
(Continued)

(56) References Cited

U.S. PATENT DOCUMENTS 6,653,910 B2 * 11/2003 Escalera ................... H01P 5/10
333/25
8,279,018 B1    10/2012 Song et al.
(Continued)

FOREIGN PATENT DOCUMENTS

| CN | 1950913 A | 4/2007 |
|----|-----------|--------|
| CN | 203746603 U | 7/2014 |
| WO | 2018189234 A1 | 10/2018 |

OTHER PUBLICATIONS

International Search Report and Written Opinion—PCT/US2019/030098—ISA/EPO—dated Aug. 29, 2019.
(Continued)

*Primary Examiner* — Ronald Hinson
(74) *Attorney, Agent, or Firm* — Qualcomm Incorporated

(57) ABSTRACT

A transformer has a first inductor that includes a first port. The transformer also has a second inductor magnetically coupled to the first inductor. The second inductor includes a second port. The second inductor includes a first portion configured to permit current flow in a clockwise direction and a second portion configured to permit current flow in a counter-clockwise direction. The transformer also has a third inductor magnetically coupled to the first inductor. The third inductor includes a third port. The counter-clockwise direction is opposite the clockwise direction to reduce magnetic coupling between the second inductor and the third inductor based on magnetic coupling cancellation.

12 Claims, 11 Drawing Sheets

(51) Int. Cl.
  *H01F 27/28*  (2006.01)
  *H04B 1/40*  (2015.01)
  *H01F 27/40*  (2006.01)
  *H04B 1/00*  (2006.01)
  *H01F 27/29*  (2006.01)

(52) U.S. Cl.
  CPC .......... *H01F 27/40* (2013.01); *H04B 1/0057* (2013.01); *H04B 1/40* (2013.01)

(58) Field of Classification Search
  USPC ........................................................ 336/200
  See application file for complete search history.

(56) References Cited

U.S. PATENT DOCUMENTS

| | | | |
|---|---|---|---|
| 9,299,764 | B2 | 3/2016 | Mattsson et al. |
| 9,543,068 | B2 | 1/2017 | Aboush et al. |
| 9,697,938 | B2 | 7/2017 | Yan et al. |
| 9,741,714 | B2 | 8/2017 | Gertenbach et al. |
| 10,340,880 | B2 * | 7/2019 | Yen .......................... H03H 7/42 |
| 2011/0248809 | A1 | 10/2011 | Gertenbach et al. |
| 2012/0201258 | A1 | 8/2012 | Bendixen et al. |
| 2012/0244802 | A1 | 9/2012 | Feng et al. |
| 2014/0077919 | A1 | 3/2014 | Godoy et al. |
| 2017/0345547 | A1 | 11/2017 | Armanious |
| 2018/0013396 | A1 | 1/2018 | Tanaka |
| 2018/0082947 | A1 | 3/2018 | Yen et al. |

OTHER PUBLICATIONS

Jiazhu X., et al., "Principle and Connection Scheme of Self-Coupled Compensating and Suppressing Harmonic Converter Transformers," vol. 21, No. 9, Sep. 2006, 7 pages.

* cited by examiner

TRIPLE INDUCTOR TRANSFORMER FOR MULTIBAND RADIO FREQUENCY INTEGRATED CIRCUITS

CROSS-REFERENCE TO RELATED APPLICATION

The present application claims the benefit of U.S. Provisional Patent Application No. 62/682,736, filed on Jun. 8, 2018, and titled "TRIPLE INDUCTOR TRANSFORMER FOR MULTIBAND RADIO FREQUENCY INTEGRATED CIRCUITS," the disclosure of which is expressly incorporated by reference herein in its entirety.

TECHNICAL FIELD

The present disclosure generally relates to wireless communications systems. More specifically, the present disclosure relates to a triple inductor transformer integrated in a diplexer/duplexer for multiband radio frequency integrated circuits.

BACKGROUND

Wireless communications systems are widely deployed to provide various types of communications content such as voice, video, data, and so on. These systems may be multiple-access systems capable of supporting simultaneous communications of multiple mobile devices with one or more base stations.

Reductions in both the size and cost of mobile devices and base stations may increase their marketability. Devices in wireless communications systems are increasingly configured to operate on multiple radio frequency (RF) bands utilizing multiple transmission technologies. One such way to reduce both the size and cost of mobile devices and base stations is the use of diplexers/duplexers. However, a device that operates on multiple radio frequency (RF) bands and that utilizes multiple transmission technologies has traditionally specified a separate switch for each radio frequency (RF) band and for each transmission technology. For example, a separate duplexer is specified for each radio frequency (RF) band and for each transmission technology. Benefits may be realized by an improved diplexer/duplexer for a radio frequency integrated circuit.

SUMMARY

A transformer has a first inductor that includes a first port. The transformer also has a second inductor magnetically coupled to the first inductor. The second inductor includes a second port. The second inductor includes a first portion configured to permit current flow in a clockwise direction and a second portion configured to permit current flow in a counter-clockwise direction. The transformer also has a third inductor magnetically coupled to the first inductor. The third inductor includes a third port. The counter-clockwise direction is opposite the clockwise direction to reduce magnetic coupling between the second inductor and the third inductor based on magnetic coupling cancellation.

A method of fabricating a transformer includes fabricating a first inductor that includes a first port. The method also includes fabricating a second inductor magnetically coupled to the first inductor. The second inductor includes a second port. The second inductor includes a first portion configured to permit current flow in a clockwise direction and a second portion configured to permit current flow in a counter-clockwise direction. The method further includes fabricating a third inductor magnetically coupled to the first inductor. The third inductor includes a third port. The counter-clockwise direction is opposite the clockwise direction to reduce magnetic coupling between the second inductor and the third inductor based on magnetic coupling cancellation.

A transformer includes a first means for storing energy in a magnetic field. The first energy storing means is accessible via a first port. The transformer also includes a second means for storing energy in a magnetic field. The second energy storing means is magnetically coupled to the first energy storing means. The second energy storing means is accessible via a second port. The second energy storing means includes a first portion configured to permit current flow in a clockwise direction and a second portion configured to permit current flow in a counter-clockwise direction. The transformer further includes a third means for storing energy in a magnetic field. The third energy storing means is magnetically coupled to the first energy storing means. The third energy storing means is accessible via a third port. The counter-clockwise direction is opposite the clockwise direction to reduce magnetic coupling between the second energy storing means and the third energy storing means based on magnetic coupling cancellation.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
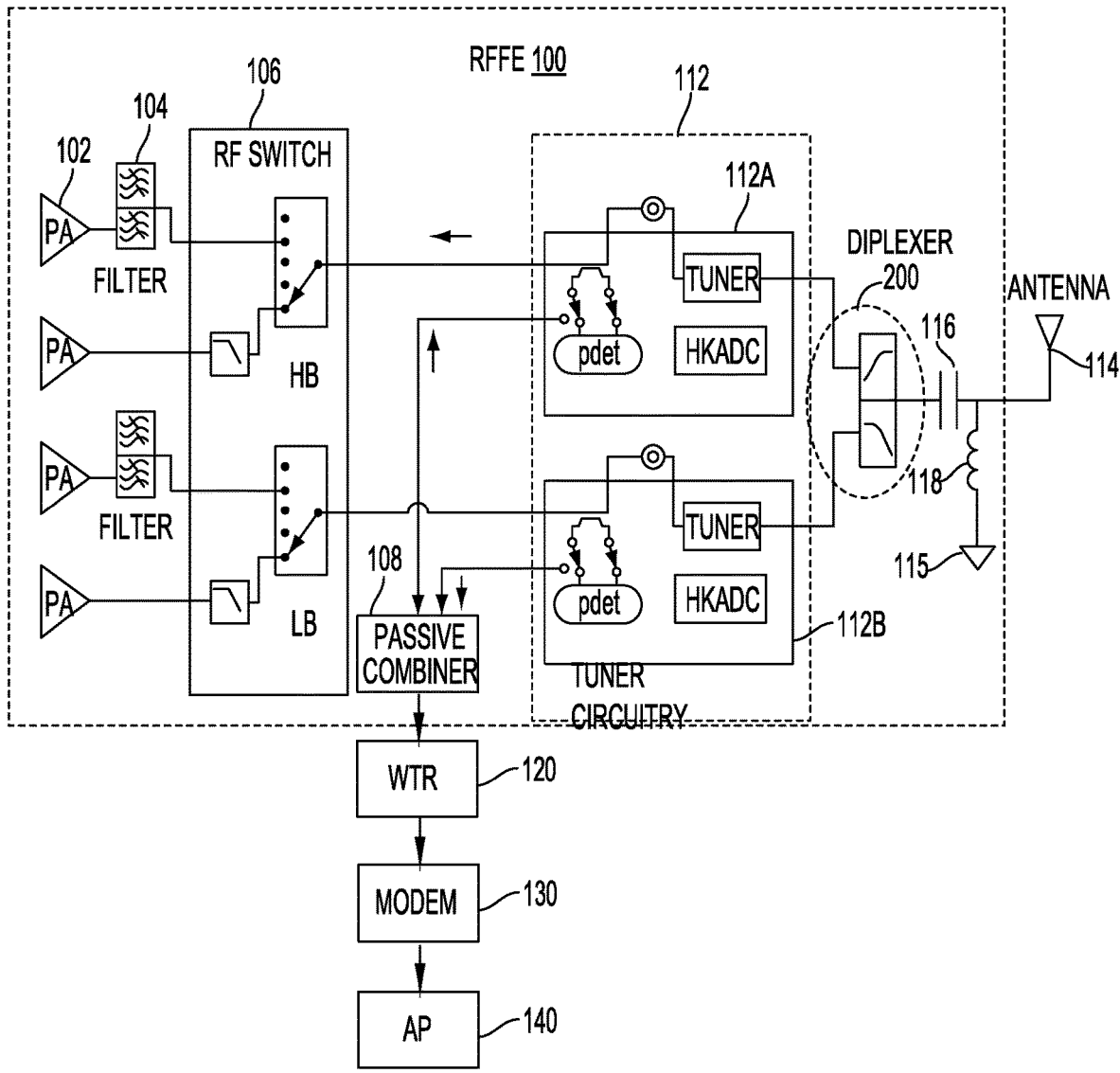
FIG. 1 is a schematic diagram of a radio frequency (RF) front-end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

For wireless communications, a diplexer can help process signals carried in a carrier aggregation system. In carrier aggregation systems, signals are communicated with both high band and low band frequencies. In a chipset, the diplexer is usually inserted between an antenna and a tuner (or an RF switch) to ensure high performance. Usually, a diplexer design includes inductors and capacitors. Diplexers can attain high performance by using inductors and capacitors that have a high quality factor (or Q). Diplexers can also attain high performance by reducing the electromagnetic coupling between components, which may be achieved through a geometry and direction of the components. Thus, reducing the electromagnetic coupling between the various components in the diplexer, while decreasing the size of the diplexer and making the most economical use of resources, would be beneficial.

Aspects of the present disclosure are directed to reducing electromagnetic coupling between components of diplexers or duplexers. For example, aspects of the present disclosure are directed to a transformer with triple inductors that may be included in the diplexers or duplexers to reduce electromagnetic coupling. The transformer includes a first inductor, a second inductor, and a third inductor that respectively include a first port, a second port, and a third port. In one aspect, the second inductor overlaps the first inductor and/or the third inductor. The first port is a shared port and may correspond to an output or input of the transformer. The second port and the third port are ports to provide or receive independent signals to or from the first port. The second inductor is magnetically coupled to the first inductor. The third inductor is magnetically coupled to the first inductor. The first port, the second port, and the third port may be oriented at different angles with respect to each other. For example, the second port and the third port may be oriented at a same angle or may be orthogonal to each other.

The second inductor includes a first portion configured to permit current flow in a first direction (e.g., a clockwise direction) and a second portion configured to permit current flow in a second direction (e.g., a counter-clockwise direction) opposite the first direction. The second direction is opposite of the first direction to reduce magnetic coupling between the second inductor and the third inductor based on magnetic coupling cancellation. This configuration effectively causes magnetic flux between the third inductor and the second inductor to be cancelled to reduce magnetic coupling to the third inductor.

The second inductor may include at least one crossing portion of the inductor traces. For example, the second inductor includes an overlapped cross portion that couples the first portion to the second portion. For example, the second inductor may be shaped in accordance with a figure eight configuration. The overlapped cross portion may include a first conductive trace and a second conductive trace. The first conductive trace and the second conductive trace are in different conductive layers. For example, the first conductive trace is configured to permit the current to flow from the first portion to the second portion and the second conductive trace is configured to permit the current to return to the first portion from the second portion. Each of the first inductor, the second inductor, and/or the third inductor may include a center tap.

FIG. 1 is a schematic diagram of a radio frequency (RF) front-end (RFFE) module 100 employing passive devices including a triple inductor transformer integrated in a diplexer (e.g., a diplexer 200 of FIG. 2)/duplexer (e.g., a duplexer 104 of FIG. 1) for multiband radio frequency integrated circuits. The RF front-end module 100 includes power amplifiers 102, the duplexer/filter 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front-end module 100.

The radio frequency (RF) front-end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog-to-digital converter (HKADC). The tuner circuitry 112 may perform impedance tuning (e.g., a voltage standing wave ratio (VSWR) optimization) for the antenna 114. The RF front-end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front-end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are contemplated.

Figure 2:
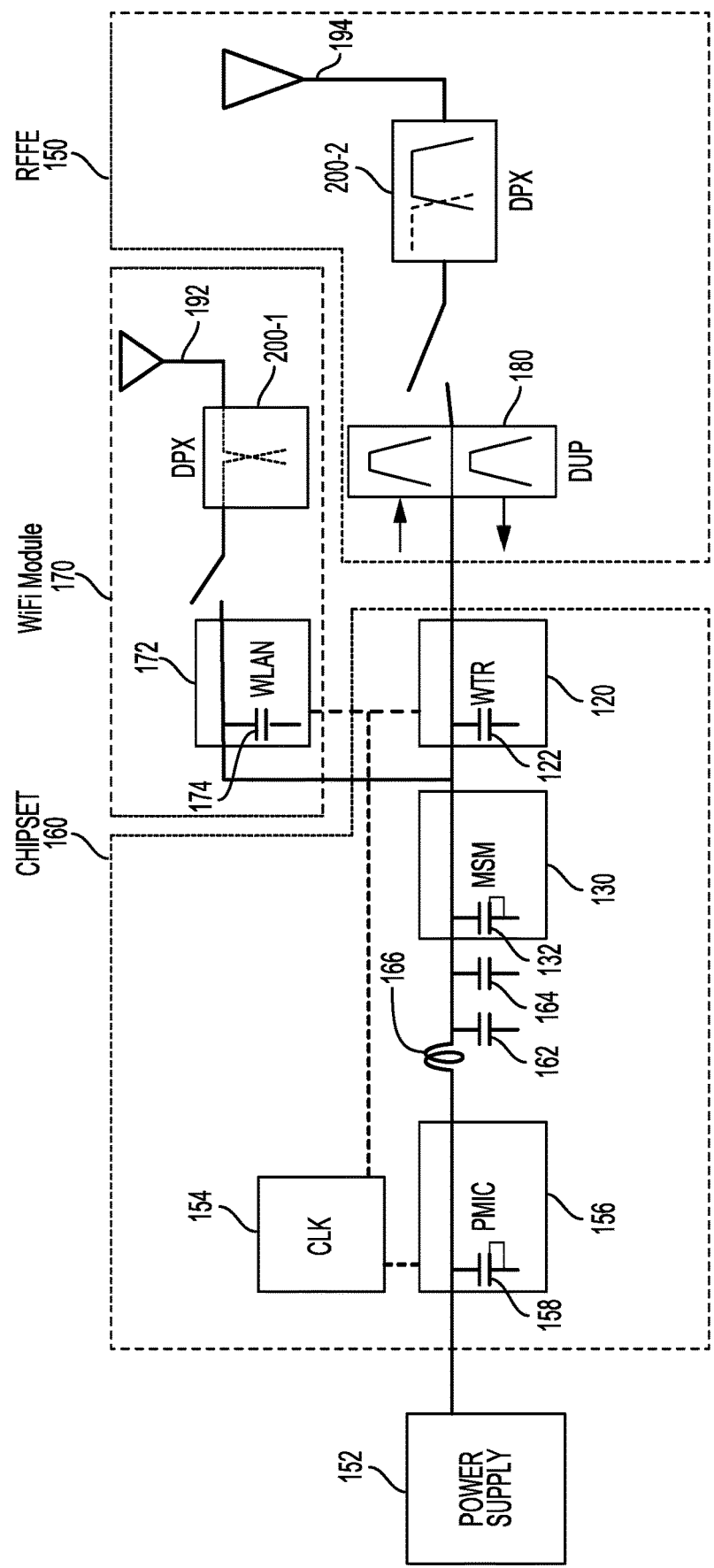
FIG. 2 is a schematic diagram of a radio frequency (RF) front-end (RFFE) module employing passive devices for a chipset.

FIG. 2 is a schematic diagram of a wireless local area network (WLAN) (e.g., WiFi) module 170 including a first diplexer 200-1 and an RF front-end (RFFE) module 150 including a second diplexer 200-2 for a chipset 160, including a triple inductor transformer integrated in a diplexer (e.g., the diplexer 200 of FIG. 2 or the first and second diplexers 200-1 and 200-2 of FIG. 2)/duplexer (e.g., a duplexer 104 of FIG. 1 or a duplexer 180 of FIG. 2) for multiband radio frequency integrated circuits. The WiFi module 170 includes the first diplexer 200-1 communicably coupling an antenna 192 to a wireless local area network module (e.g., WLAN module 172). The RF front-end module 150 includes the second diplexer 200-2 communicably coupling an antenna 194 to the wireless transceiver (WTR) 120 through THE duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156.

Figure 3:
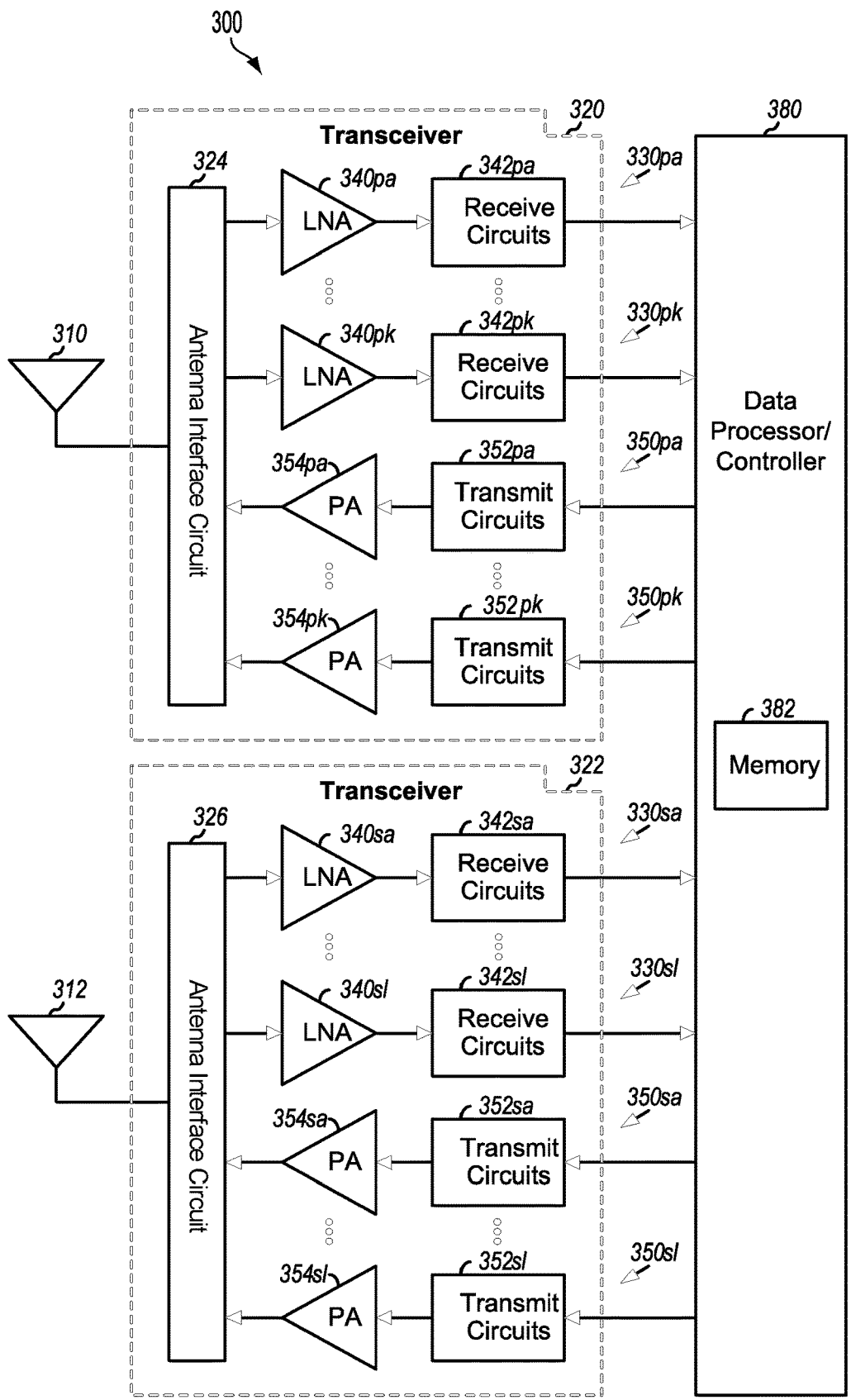
FIG. 3 shows an exemplary design of a receiver and transmitter.

FIG. 3 shows a block diagram of an exemplary design of wireless device 300 or user equipment. In this exemplary design, the wireless device 300 includes a transceiver 320 coupled to a primary antenna 310, a transceiver 322 coupled to a secondary antenna 312, and a data processor/controller 380. The transceiver 320 includes multiple (K) receivers 330pa to 330pk and multiple (K) transmitters 350pa to 350pk to support multiple frequency bands, multiple radio technologies, carrier aggregation, etc. The transceiver 322 includes L receivers 330sa to 330s1 and L transmitters 350sa to 350s1 to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 3, each receiver 330 includes a low noise amplifier (LNA) 340 and receive circuits 342. For data reception, the antenna 310 receives signals from base stations and/or other transmitter stations and provides a received radio frequency (RF) signal, which is routed through an antenna interface circuit 324 and presented as an input RF signal to a selected receiver 330. An antenna interface circuit 324 may include switches, duplexers, diplexers, transmit filters, receive filters, matching circuits, etc. The description below assumes that the receiver 330pa is the selected receiver. Within the receiver 330pa, an LNA 340pa amplifies the input RF signal and provides an output RF signal. Receive circuits 342pa down- convert the output RF signal from RF to baseband, amplify and filter the downconverted signal, and provide an analog input signal to data processor 380. Receive circuits 342pa may include mixers, filters, amplifiers, matching circuits, an oscillator, a local oscillator (LO) generator, a phase locked loop (PLL), etc. Each remaining receiver 330 in the transceivers 320 and 322 may operate in a similar manner as the receiver 330pa.

In the exemplary design shown in FIG. 3, each transmitter 350 includes transmit circuits 352 and a power amplifier (PA) 354. For data transmission, a data processor 380 processes (e.g., encodes and modulates) data to be transmitted and provides an analog output signal to a selected transmitter. The description below assumes that the transmitter 350pa is the selected transmitter. Within the transmitter 350pa, transmit circuits 352pa amplify, filter, and upconvert the analog output signal from baseband to RF and provide a modulated RF signal. The transmit circuits 352pa may include amplifiers, filters, mixers, matching circuits, an oscillator, an LO generator, a PLL, etc. A power amplifier (PA) 354pa receives and amplifies the modulated RF signal and provides a transmit RF signal having the proper output power level. The transmit RF signal is routed through the antenna interface circuit 324 and transmitted via the antenna 310. Each remaining transmitter 350 in the transceivers 320 and 322 may operate in a similar manner as the transmitter 350pa.

FIG. 3 shows an exemplary design of a receiver 330 and transmitter 350. The receiver 330 and a transmitter 350 may also include other circuits not shown in FIG. 3, such as filters, matching circuits, etc. All or a portion of transceivers 320 and 322 may be implemented on one or more analog integrated circuits (ICs), RF ICs (RFICs), mixed-signal ICs, etc. For example, LNAs 340 and receive circuits 342 within transceivers 320 and 322 may be implemented on multiple ICs, as described below. The circuits in transceivers 320 and 322 may also be implemented in other manners.

The data processor/controller 380 may perform various functions for the wireless device 300. For example, the data processor 380 may perform processing for data being received via the receivers 330 and data being transmitted via the transmitters 350. The controller 380 may control the operation of the various circuits within the transceivers 320 and 322. In some aspects, the transceivers 320 and 322 may also comprise a controller to control various circuits within the respective transceiver (e.g., LNAs 340). A memory 382 may store program codes and data for the data processor/controller 380. The data processor/controller 380 may be implemented on one or more application specific integrated circuits (ASICs) and/or other ICs.

Figure 4:
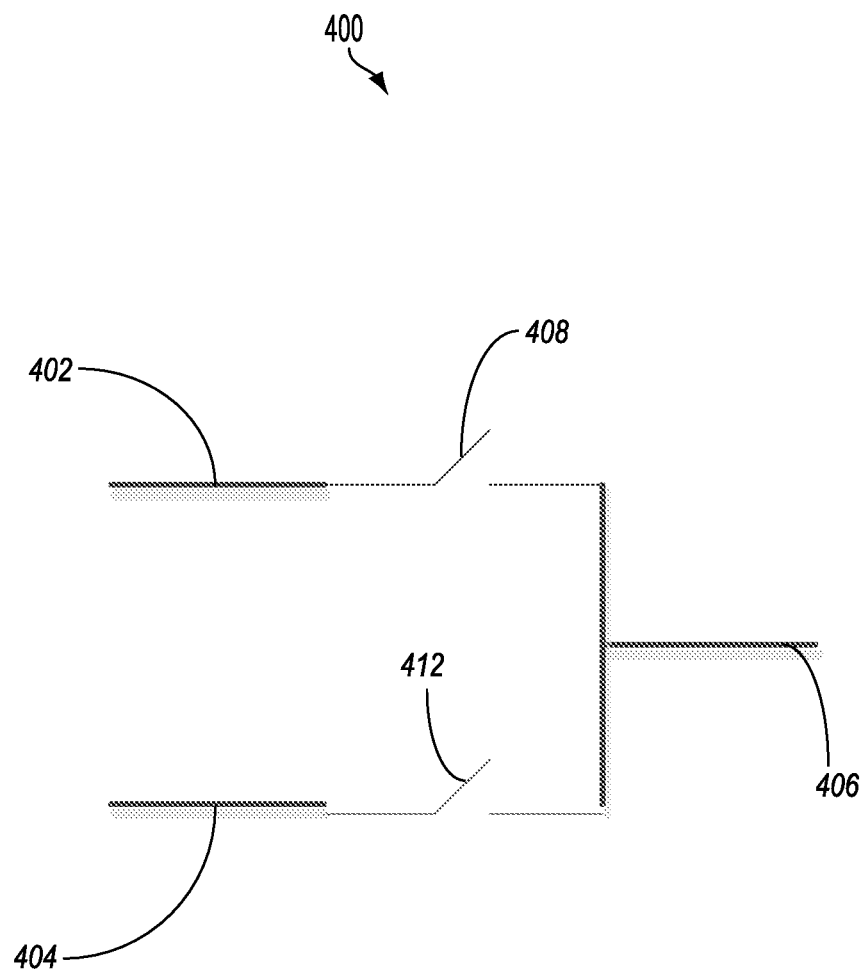
FIG. 4 illustrates an example multi-path configuration for concurrently receiving/transmitting in two different frequency bands.

FIG. 4 illustrates an example multi-path configuration 400 for concurrently receiving/transmitting in two different frequency bands. The configuration 400 shows a first frequency band path 402 (e.g., twenty-eight (28) gigahertz (GHz)) and a second frequency band path 404 (e.g., thirty-nine (39) GHz). Each of the first frequency band path 402 and the second frequency band path 404 is selectively coupled to an antenna (not shown) via a shared path 406. For example, the first frequency band path 402 and the second frequency band path 404 are selectively coupled to the antenna by respective switches 408 and 412.

The multi-path configuration 400 including the switches 408 and 412 is subject to drawbacks including increased parasitic resistance that results in additional loss and increased parasitic capacitance. Moreover, the switch implementation cannot combine two frequency bands to be transmitted simultaneously.

Aspects of the present disclosure are directed to a multi-path configuration that is based on a triple inductor transformer. For example, the triple inductor transformer may form a diplexer or be integrated in a diplexer for multiband radio frequency integrated circuits. The multi-path configuration (e.g., diplexer) combines two frequency band signals from two paths into one path or divides one path signal into two paths for two frequency bands. The examples are directed to a two-path configuration. However, it is to be appreciated that substantially limitless configurations (e.g., multiplexers) are possible.

Figure 5:
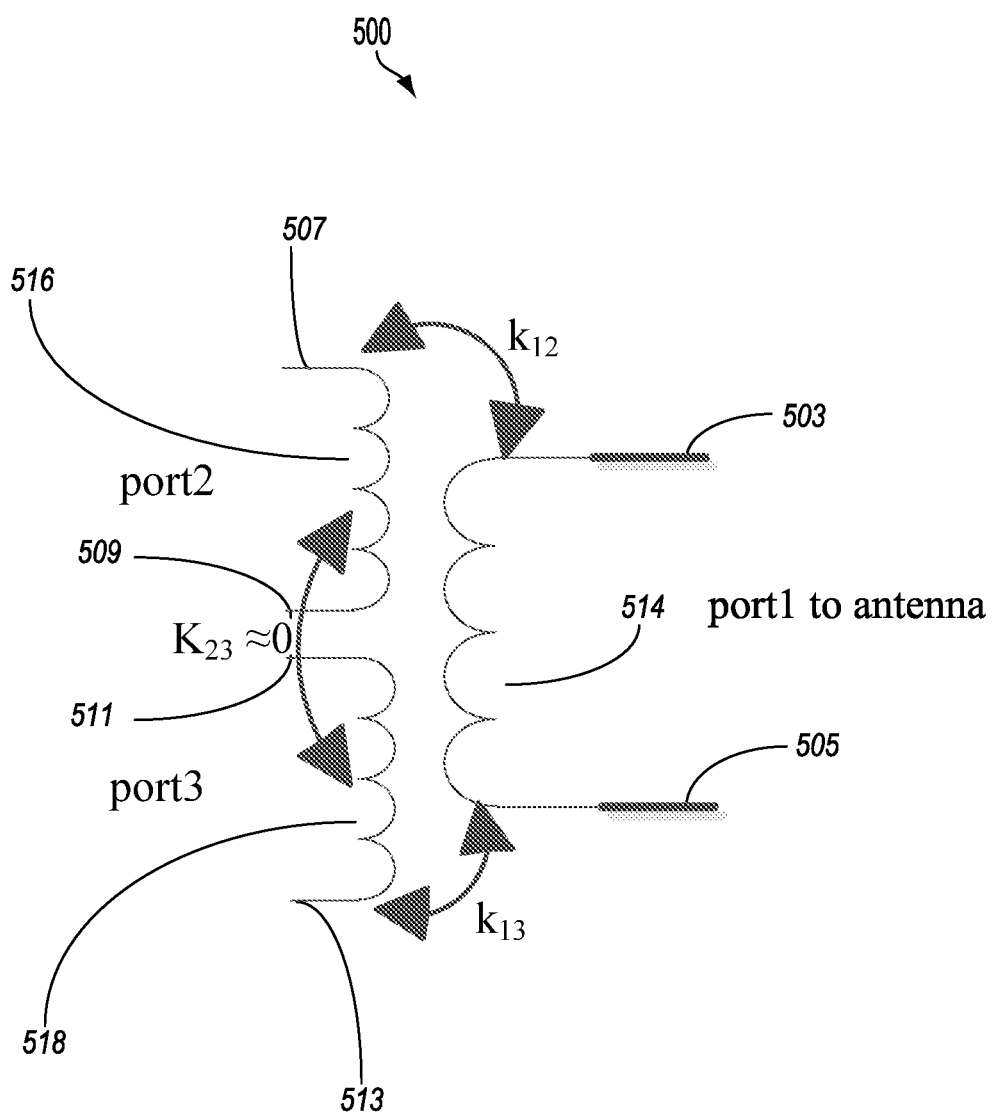
FIG. 5 illustrates a triple inductor transformer integrated in a diplexer/duplexer for multiband radio frequency integrated circuits, according to aspects of the present disclosure.

FIG. 5 illustrates a triple inductor transformer 500, according to aspects of the present disclosure. The triple inductor transformer 500 may be integrated in a diplexer/duplexer for multiband radio frequency integrated circuits. The triple inductor transformer 500 includes a first coil (or inductor) 514, a second coil 516, and a third coil 518. The first coil 514 includes a first port, port1, which may be a differential port that includes a first sub-port 503 and a second sub-port 505. The second coil 516 includes a second port, port2, which may be a differential port that includes a third sub-port 507 and a fourth sub-port 509. The third coil 518 includes a third port, port3, which may be a differential port that includes a fifth sub-port 511 and a sixth sub-port 513. Although not shown, all three of the ports (port1, port2, and port 3) may be connected to capacitors, transistors, and/or resistors.

The triple inductor transformer 500 may be subject to magnetic coupling between the coils. The magnetic coupling may result in energy being transferred between the coils. The magnetic coupling coefficient between the first coil 514 and the second coil 516 is represented by $k_{12}$ and magnetic coupling coefficient between the first coil 514 and the third coil 518 is represented by $k_{13}$. The magnetic coupling coefficients $k_{12}$ and $k_{13}$ are the desired magnetic coupling for the triple inductor transformer 500.

The magnetic coupling coefficient between the second coil 516 and the third coil 518 is represented by $k_{23}$. It is desirable to achieve a near zero magnetic coupling coefficient ($k_{23}$) between the second port, port2, and the third port, port3. For example, the magnetic coupling coefficient $k_{23}$ should be less than 0.1. A high performance diplexer with near zero magnetic coupling between the second port, port2, and the third port, port3, is achieved through a geometry and direction of the components, as illustrated in FIG. 5. When the transformer is configured as a diplexer, each of the second port, port2, and the third port, port3, may be used for transmitting in one or more bands or for receiving in the one or more bands. In another aspect, the triple inductor transformer 500 may be a duplexer. For example, the second port, port2, may be used for transmitting in one or more bands and the third port, port3, may be used for receiving in the one or more bands.

The triple inductor transformer 500 according to aspects of the present disclosure removes insertion loss associated with a switch and achieves high isolation between the second port, port2, and the third port, port3. Moreover, the second port, port2, and the third port, port3, can send signals to the first port, port1, simultaneously.

Figure 6:
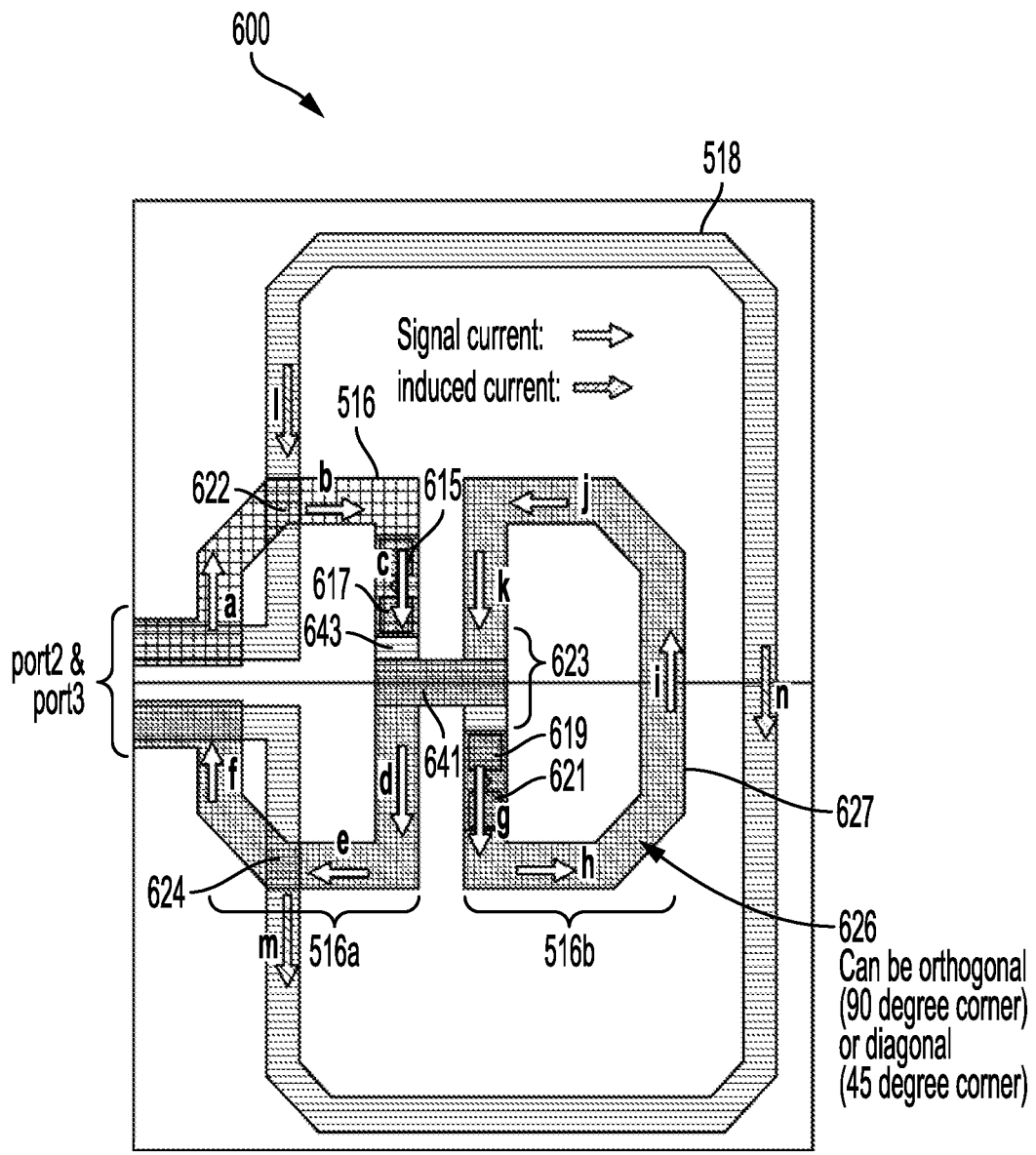
FIG. 6 illustrates a schematic diagram of two inductors of a triple inductor transformer, according to aspects of the present disclosure.

FIG. 6 illustrates a schematic diagram of two inductors of a triple inductor transformer 600, according to aspects of the present disclosure. For illustrative purposes, some of the labelling and numbering of the devices and features of FIG. 6 are similar to those of FIG. 5. The two inductors may be the second coil 516 and the third coil 518, shown in FIG. 5. The second coil 516 may be shaped in accordance with a crossed configuration (e.g., a figure eight configuration). The third coil 518 may be configured to accommodate the crossed configuration of the second coil 516 in order to achieve a near zero magnetic coupling coefficient ($k_{23}$) between the second port, port2, and the third port, port3, of the triple inductor transformer 600. For example, the third coil 518 may designed in a substantially rectangular/square shape that partially surrounds the second coil 516.

In one aspect, most of the conductive traces of each of the second coil 516 and the third coil 518 are in a same conductive layer (e.g., a first conductive layer). However, in regions where the second coil 516 and the third coil 518 overlap, the overlapped portions are in different layers (e.g., a second conductive layer and the first conductive layer). For example, port2 and port3 of the triple inductor transformer 600 are in different conductive layers. Similarly, in regions 622 and 624 where the second coil 516 and the third coil 518 overlap, the traces of the second coil 516 and the traces of the third coil 518 are in different layers. The traces in the different layers may be connected or coupled to other layers using vias.

When a radio frequency signal (e.g., current) is moved, a current is induced in the surrounding coils. For example, the current that enters at the second port, port2, flows through a first portion 516a and a second portion 516b of the second coil 516, and an induced current is generated in the third coil 518. The second coil 516 is designed in the figure eight configuration to cause current to flow in the first portion 516a in a clockwise direction while current flows in the second portion 516b in a counter-clockwise direction.

For example, the current in the clockwise direction is represented by the arrows a, b, c, d, e, and f. The current in the counter-clockwise direction is represented by the arrows g, h, i, j, and k. The current in the clockwise direction and the counter-clockwise direction traverse the second coil 516 through a cross region 623 through a first set of vias 615, 617, and a second set of vias 619 and 621. For example, the current flows in the direction represented by the arrows a, b, and c in a first conductive layer then through the first set of vias 615, 617 to a second conductive layer then back to the first conductive layer using the second set of vias 619 and 621. The current then continues in the direction represented by the arrows g, h, i, j, k, d, e, and f.

The current in the clockwise direction generates a first induced current in a counter-clockwise direction represented by the arrows l and m. The current in the counter-clockwise direction generates a second induced current in a clockwise direction represented by the arrow n. The first induced current (represented by the arrows l and m) cancels out the second induced current (represented by the arrow n). In other words, the magnetic coupling between the second coil 516 and the third coil 518 is near or substantially zero. This follows because the first induced current in the direction represented by the arrows l and m cancels the second induced current in an opposing direction or counter-clockwise direction represented by the arrow n.

In one aspect of the disclosure, one or more corners of the first portion 516a and/or the second portion 516b of the second coil 516 are configured with different angles to increase efficiency. For example, the traces of the one or more corners may be connected at a desirable angle to reduce interference from nearby traces or devices. In one aspect, the traces of the one or more corners of the first portion 516a and/or the second portion 516b are configured at an angle less than ninety degrees (e.g., forty-five degrees). For example, a trace 626 corresponding to a corner of the second portion 516b is configured at an angle of forty-five degrees relative to a trace 627 of the second portion 516b.

Additionally, the cross/twist region 623 includes cross traces of the second coil 516 that are configured orthogonally. For example, a first cross trace 641 is orthogonal to a second cross trace 643. The first cross trace 641 is in a different conductive layer than the second cross trace 643.

Figure 7:
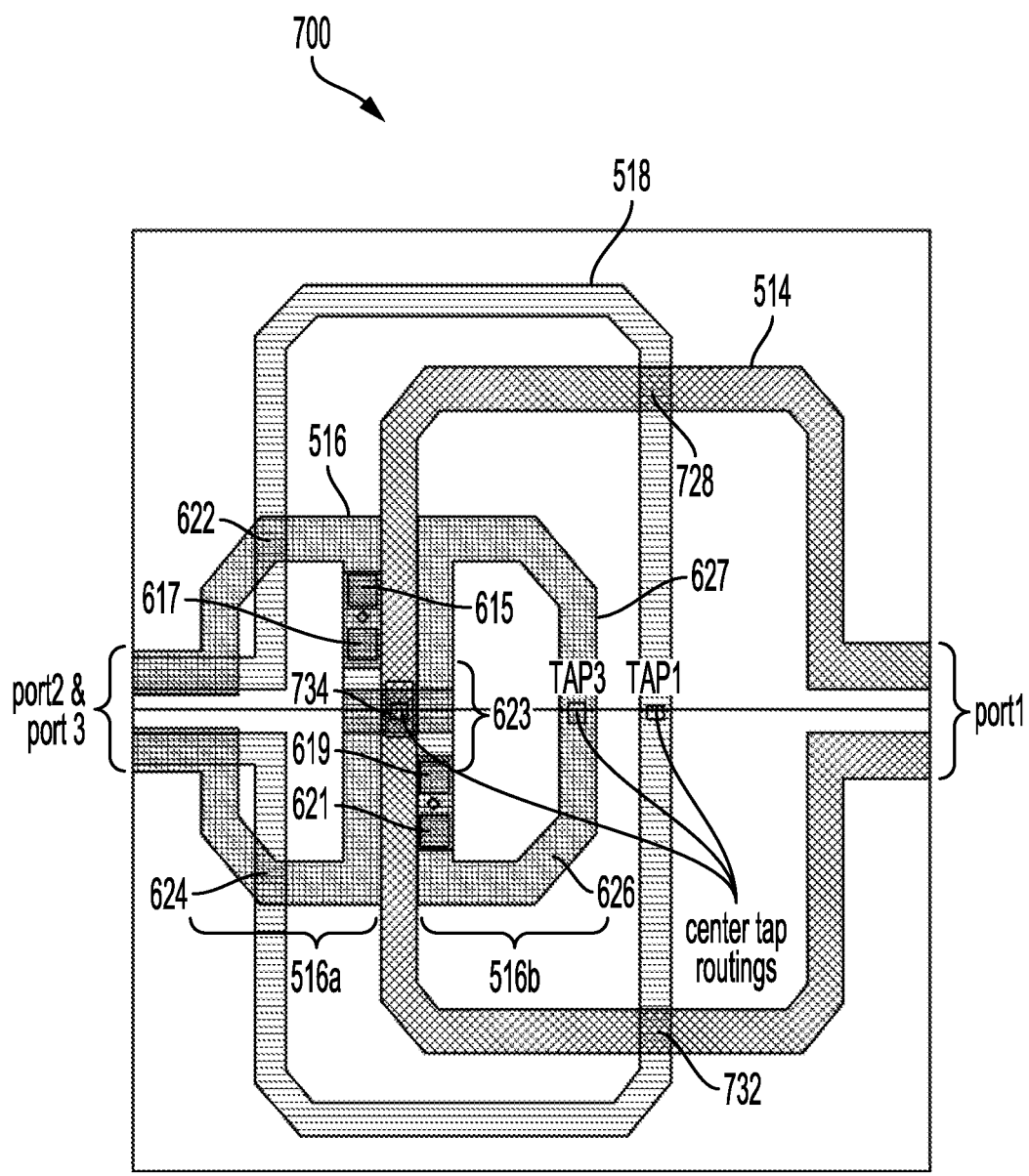
FIG. 7 illustrates a schematic diagram of a triple inductor transformer, according to aspects of the present disclosure.

FIG. 7 illustrates a schematic diagram of a triple inductor transformer 700, according to aspects of the present disclosure. For illustrative purposes, some of the labelling and numbering of the devices and features of FIG. 7 are similar to those of FIGS. 5 and 6. FIG. 7, however, includes the first coil (or inductor) 514 in combination with the second coil 516 and the third coil 518, shown in FIG. 5. The second coil 516 is shaped in accordance with a crossed configuration (e.g., a figure eight configuration). The first coil (or inductor) 514 and the third coil 518 may be configured to accommodate the crossed configuration of the second coil 516. For example, the first coil 514 and the third coil 518 may be designed in a substantially rectangular/square shape that partially surrounds the second coil 516. The first coil 514 and the third coil 518 may be designed to achieve the desirable magnetic coupling coefficient $k_{12}$ and $k_{13}$ for the triple inductor transformer 700.

In this aspect of the present disclosure, the first coil 514 is designed in a substantially rectangular/square shape that partially surrounds the third coil 518. In regions of the triple inductor transformer 700 where the first coil 514 overlaps the second coil 516 and the third coil 518, the overlapped portions are in different conductive layers. For example, in regions 728 and 732 where the first coil 514 and the third coil 518 overlap, the traces of the first coil 514 and the traces of the third coil 518 are in different layers. Similarly, in region 734 where the first coil 514 and the second coil 516 overlap, the trace of the first coil 514 and the trace of the second coil 516 are in different layers. The traces in the different layers may be connected or coupled to other layers using vias. Each of the first coil 514, the second coil 516, and the third coil 518 include center tap routings. In the present disclosure, the first inductor 514 and third inductor 518 are designed with a one turn structure. In some applications, the inductors may be designed with multiple turns.

Figure 8:
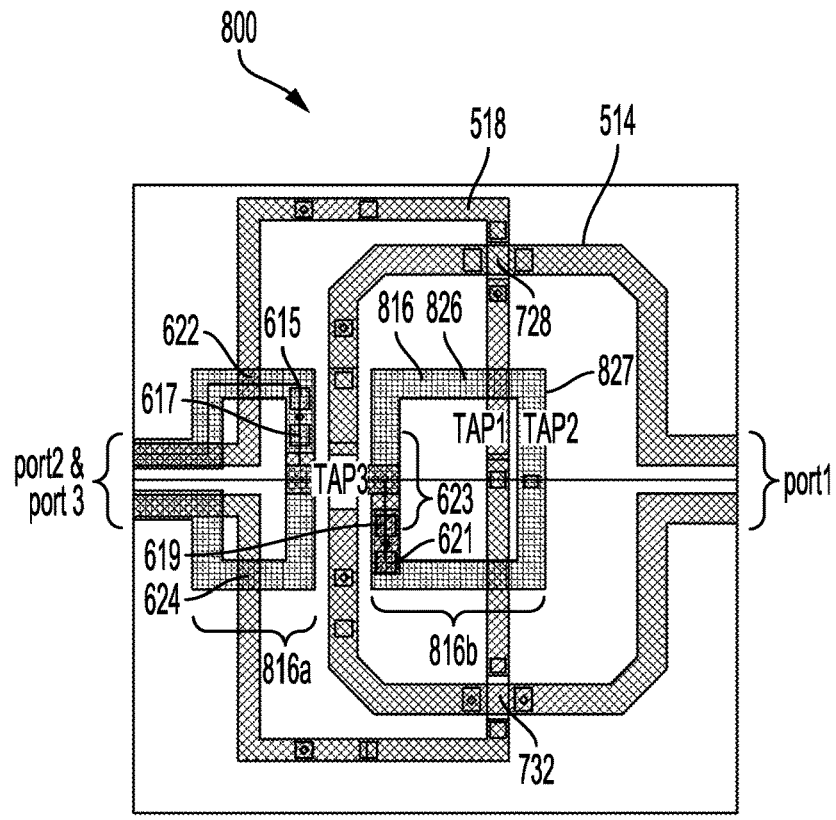
FIG. 8 illustrates a schematic diagram of a triple inductor transformer, according to aspects of the present disclosure.

FIG. 8 illustrates a schematic diagram of a triple inductor transformer 800, according to aspects of the present disclosure. For illustrative purposes, some of the labelling and numbering of the devices and features of FIG. 8 are similar to those of FIGS. 5, 6, and 7. However, a second coil 816 of FIG. 8 includes a first portion 816*a* and a second portion 816*b* that are shaped differently than the first portion 516*a* and the second portion 516*b* of the second coil 516 of FIGS. 6 and 7. In one aspect, one or more corners of the first portion 816*a* and/or the second portion 816*b* are orthogonal. For example, a trace 826 corresponding to a corner of the second portion 816*b* is configured at an angle of ninety degrees relative to a trace 827 of the second portion 816*b*. The first portion 816*a* and the second portion 816*b* can have a same or different shape or size.

Figure 9:
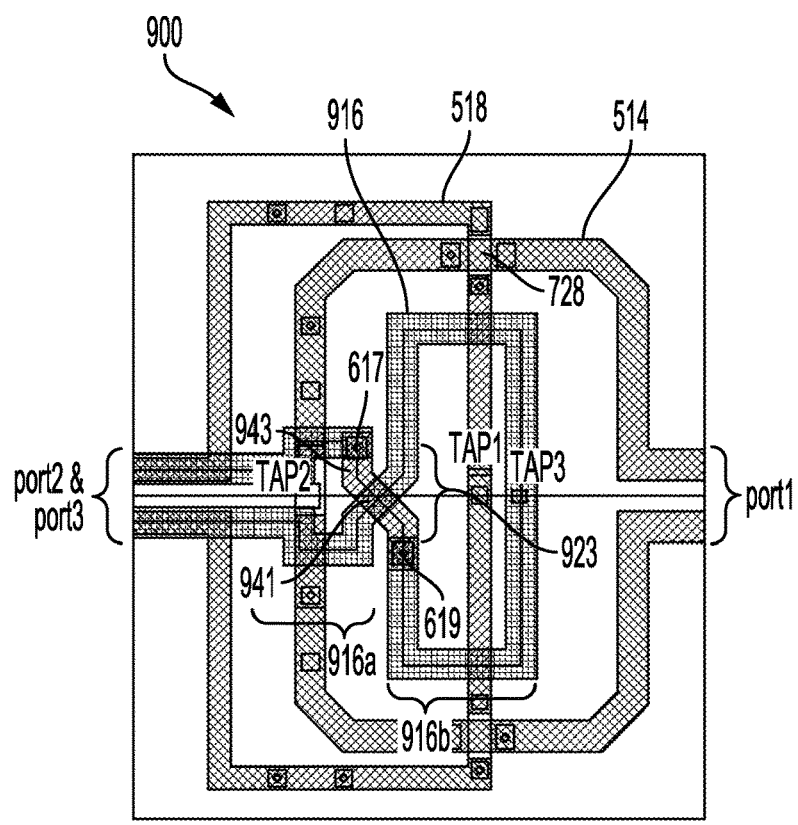
FIG. 9 illustrates a schematic diagram of a triple inductor transformer, according to aspects of the present disclosure.

FIG. 9 illustrates a schematic diagram of a triple inductor transformer 900, according to aspects of the present disclosure. For illustrative purposes, some of the labelling and numbering of the devices and features of FIG. 9 are similar to those of FIGS. 5, 6, 7, and 8. However, a second coil 916 of FIG. 9 includes a first portion 916*a* and a second portion 916*b* and a cross/twist region 923 that is shaped differently than the cross/twist region 623 of the second coil 516 of FIGS. 6, 7, and 8. In this aspect, the cross/twist region 923 includes cross traces of the second coil 916 that are configured diagonally. For example, a first cross trace 941 is diagonal relative to a second cross trace 943.

Figure 10:
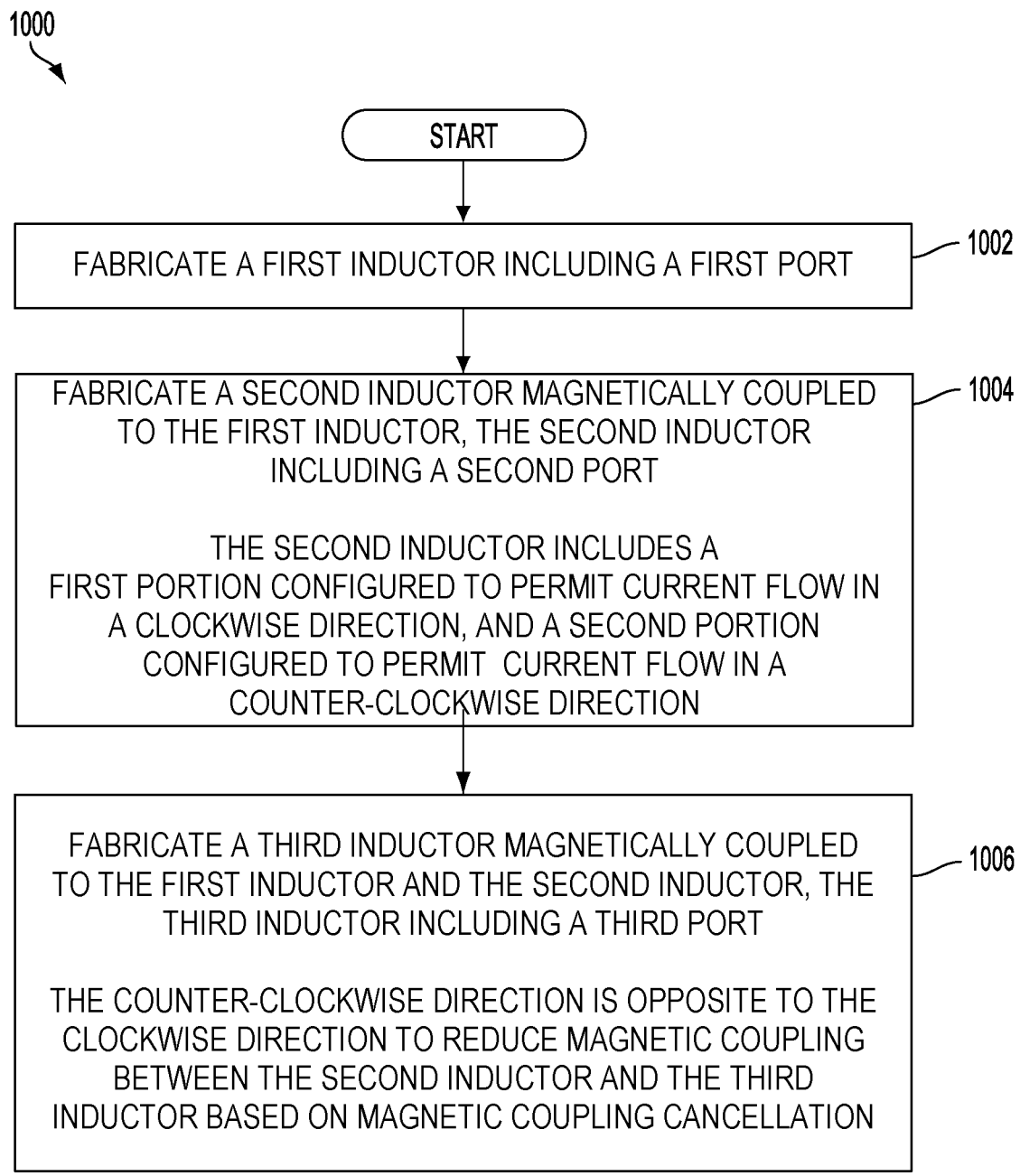
FIG. 10 depicts a simplified flowchart of a method of wireless communications, according to aspects of the present disclosure.

FIG. 10 depicts a simplified flowchart of a method 1000 of fabricating a transformer. At block 1002, a first inductor including a first port is fabricated. At block 1004, a second inductor magnetically coupled to the first inductor is fabricated. The second inductor includes a second port. The second inductor also includes a first portion configured to permit current flow in a clockwise direction and a second portion configured to permit current flow in a counter-clockwise direction. At block 1006 a third inductor magnetically coupled to the first inductor and the second inductor is fabricated. The third inductor includes a third port. The counter-clockwise direction is opposite the clockwise direction to reduce magnetic coupling between the second inductor and the third inductor based on magnetic coupling cancellation.

According to one aspect of the present disclosure, a triple inductor transformer is described. The triple inductor transformer includes first, second and third means for storing energy in a magnetic field. The first energy storing means may, for example, be the first coil (or inductor) 514. The second energy storing means may, for example, be the second coil 516, the second coil 816, and/or the second coil 916. The third energy storing means may, for example, be the third coil 518. In another aspect, the aforementioned means may be any module or any apparatus or material configured to perform the functions recited by the aforementioned means.

Figure 11:
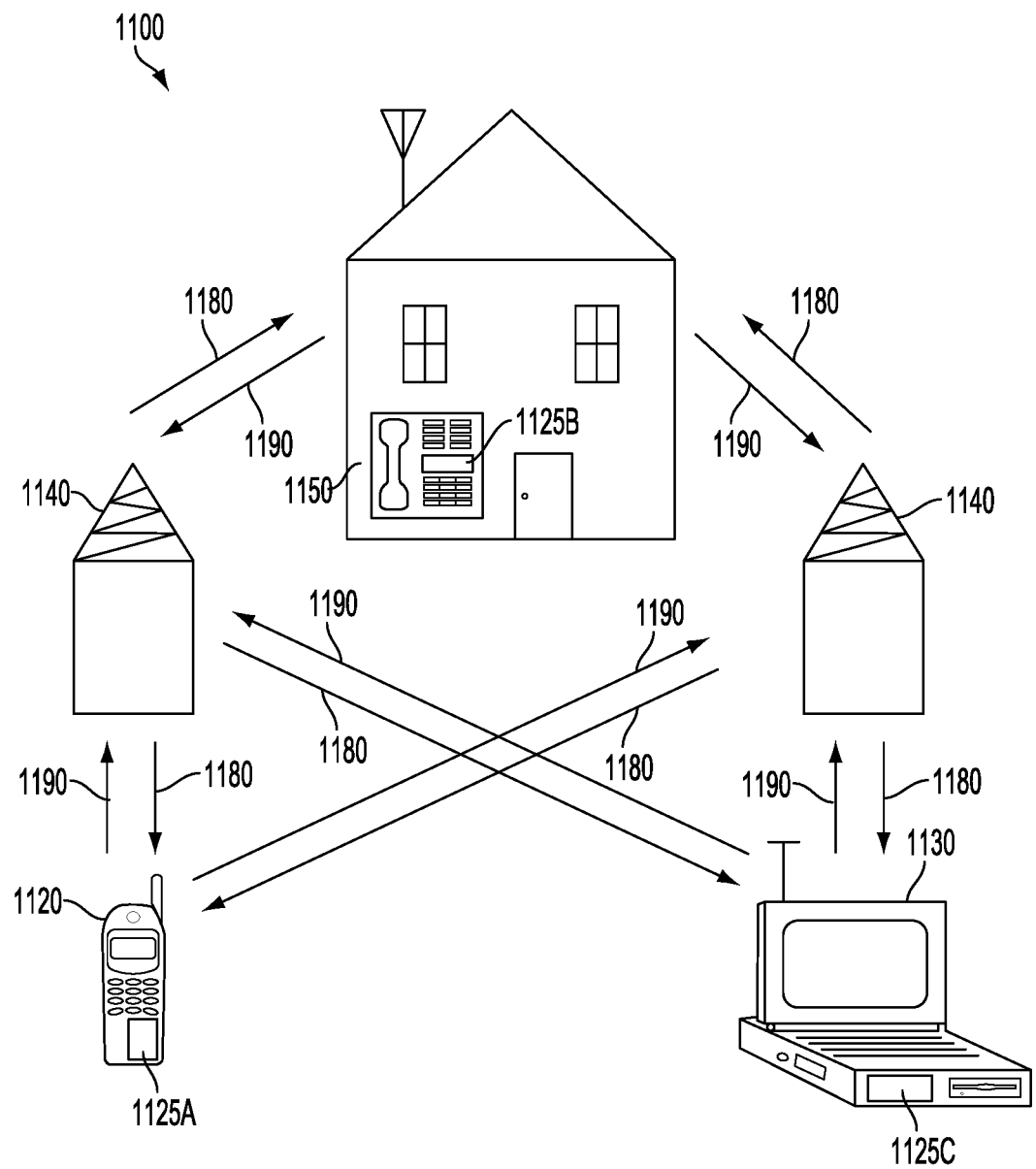
FIG. 11 is a block diagram showing an exemplary wireless communications system in which a configuration of the disclosure may be advantageously employed.

FIG. 11 is a block diagram showing an exemplary wireless communications system in which a configuration of the disclosure may be advantageously employed. For purposes of illustration, FIG. 11 shows three remote units 1120, 1130, and 1150 and two base stations 1140. It will be recognized that wireless communications systems may have many more remote units and base stations. Remote units 1120, 1130, and 1150 include IC devices 1125A, 1125B, and 1125C that include the disclosed triple inductor transformer. It will be recognized that other devices may also include the disclosed triple inductor transformer, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base station 1140.

In FIG. 11, remote unit 1120 is shown as a mobile telephone, remote unit 1130 is shown as a portable computer, and remote unit 1150 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the triple inductor transformer.

Figure 12:
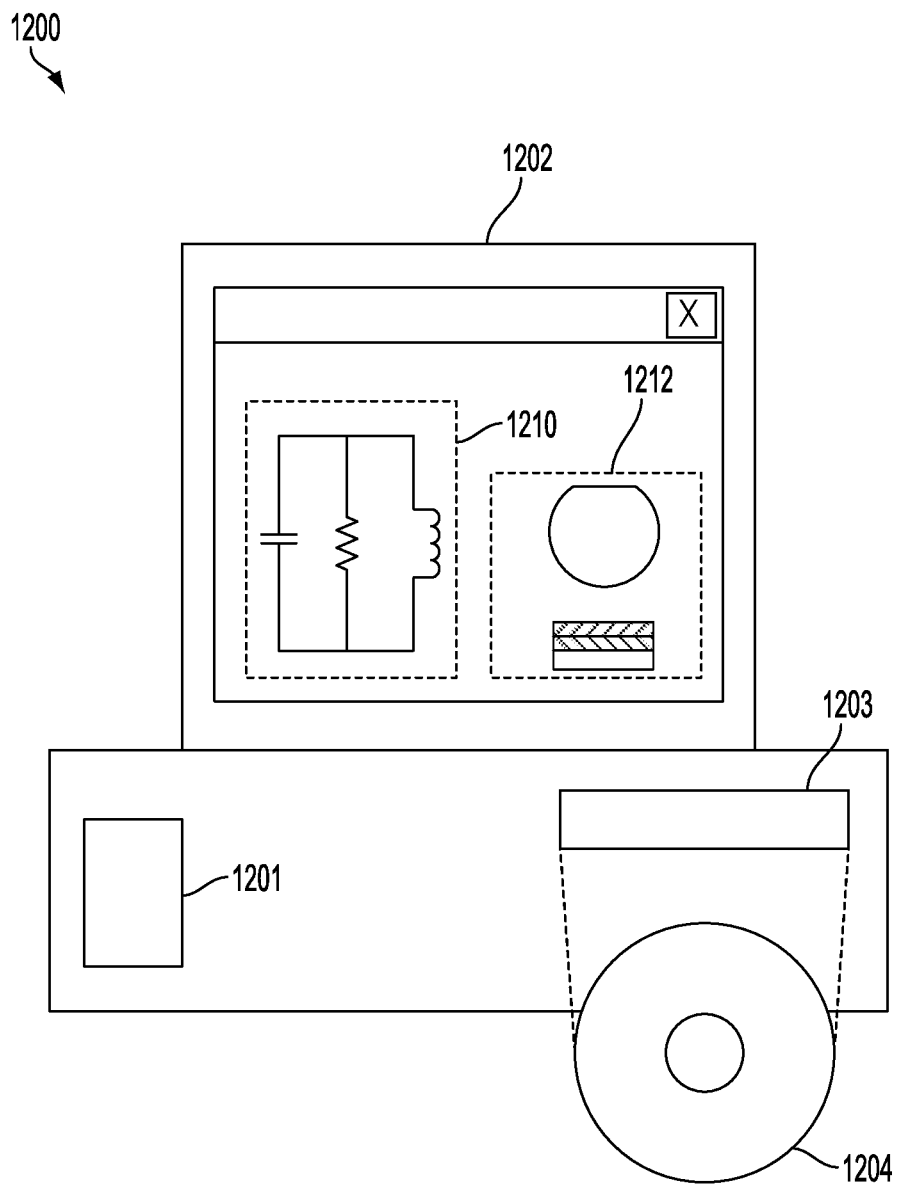
FIG. 12 is a block diagram illustrating a design workstation used for circuit, layout, and logic design of a three-dimensional passive structure, according to aspects of the present disclosure.

FIG. 12 is a block diagram illustrating a design workstation used for circuit, layout, and logic design of a triple inductor transformer. A design workstation 1200 includes a hard disk 1201 containing operating system software, support files, and design software such as Cadence or OrCAD. The design workstation 1200 also includes a display 1202 to facilitate design of a circuit 1210 or the triple inductor transformer. A storage medium 1204 is provided for tangibly storing the design of the circuit 1210 or the triple inductor transformer. The design of the circuit 1210 or the triple inductor transformer may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the triple inductor transformer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A transformer, comprising:
    a first inductor including a first port;
    a second inductor magnetically coupled to the first inductor, the second inductor including a second port, the second inductor comprising a first portion configured to permit current flow in a clockwise direction and a second portion configured to permit current flow in a counter-clockwise direction; and
    a third inductor magnetically coupled to the first inductor and to the second inductor, the magnetic coupling between the third inductor and the second inductor being represented by a magnetic coupling coefficient, the third inductor including a third port, in which the counter-clockwise direction is opposite the clockwise direction to reduce the magnetic coupling coefficient to less than 0.1 between the second inductor and the third inductor based on magnetic coupling cancellation,
    wherein the second inductor is shaped in accordance with a figure eight configuration and in which the second inductor comprises an overlapped cross portion that couples the first portion to the second portion.

2. The transformer of claim 1, in which the overlapped cross portion comprises a first conductive trace and a second conductive trace in a different conductive layer than the first conductive trace.

3. The transformer of claim 1, in which the overlapped cross portion is shaped in accordance with an orthogonal configuration or is shaped in accordance with a diagonal configuration.

4. The transformer of claim 1, in which the second inductor overlaps the first inductor and/or the third inductor.

5. The transformer of claim 1, in which the first inductor, the second inductor, and/or the third inductor comprise a center tap.

6. The transformer of claim 1, in which the at least one corner of the first portion or the second portion of the second inductor is shaped in accordance with an orthogonal configuration or a diagonal configuration.

7. The transformer of claim 1, in which the first port is coupled to an antenna.

8. The transformer of claim 7, in which the second inductor and the third inductor are configured to simultaneously transmit multiple radio frequency (RF) bands to the first inductor or simultaneously receive multiple RF bands from the first inductor.

9. The transformer of claim 1, in which the first inductor and/or the third inductor comprises multiple turns.

10. A transformer, comprising:
first means for storing energy in a magnetic field, the first energy storing means being accessible via a first port;
second means for storing energy in a magnetic field, the second energy storing means magnetically coupled to the first energy storing means, the second energy storing means being accessible via a second port, the second energy storing means comprising a first portion configured to permit current flow in a clockwise direction and a second portion configured to permit current flow in a counter-clockwise direction; and
third means for storing energy in a magnetic field, the third energy storing means magnetically coupled to the first energy storing means and to the second storing means, the magnetic coupling between the third storing means and the second storing means being represented by a magnetic coupling coefficient, the third energy storing means being accessible via a third port, in which the counter-clockwise direction is opposite the clockwise direction to reduce the magnetic coupling coefficient to less than 0.1 between the second energy storing means and the third energy storing means based on magnetic coupling cancellation,
wherein the second storing means is shaped in accordance with a figure eight configuration and in which the second storing means overlaps the first energy storing means and/or the third energy storing means.

11. The transformer of claim 10, in which the first port is coupled to an antenna.

12. The transformer of claim 11, in which the second energy storing means and the third energy storing means are configured to simultaneously transmit multiple radio frequency (RF) bands to the first energy storing means or simultaneously receive multiple RF bands from the first energy storing means.

* * * * *